United States Patent
Ikeda

(10) Patent No.: US 11,652,189 B2
(45) Date of Patent: May 16, 2023

(54) DISPLAY DEVICE

(71) Applicant: Japan Display Inc., Tokyo (JP)

(72) Inventor: Masanobu Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 212 days.

(21) Appl. No.: 17/350,739

(22) Filed: Jun. 17, 2021

(65) Prior Publication Data

US 2021/0399172 A1     Dec. 23, 2021

(30) Foreign Application Priority Data

Jun. 18, 2020    (JP) .............................. JP2020-105576

(51) Int. Cl.
| | |
|---|---|
| *H01L 33/22* | (2010.01) |
| *H01L 25/075* | (2006.01) |
| *H01L 27/12* | (2006.01) |
| *H01L 33/62* | (2010.01) |
| *H01L 33/00* | (2010.01) |
| *G09G 3/32* | (2016.01) |

(52) U.S. Cl.
CPC .......... *H01L 33/22* (2013.01); *H01L 25/0753* (2013.01); *H01L 27/1214* (2013.01); *H01L 33/0093* (2020.05); *H01L 33/62* (2013.01); *G09G 3/32* (2013.01); *H01L 2933/0066* (2013.01)

(58) Field of Classification Search
None
See application file for complete search history.

(56) References Cited

U.S. PATENT DOCUMENTS

| | | | | |
|---|---|---|---|---|
| 8,502,193 | B2* | 8/2013 | Song | H01L 33/04 257/15 |
| 8,791,480 | B2* | 7/2014 | Song | H01L 33/42 257/94 |
| 2011/0303938 | A1* | 12/2011 | Uemura | H01L 33/24 257/98 |
| 2013/0126919 | A1* | 5/2013 | Yamasaki | H01L 33/145 257/E33.014 |
| 2018/0198047 | A1 | 7/2018 | Danesh et al. | |

FOREIGN PATENT DOCUMENTS

| | | |
|---|---|---|
| JP | H08-111544 A | 4/1996 |
| JP | 2001-144329 A | 5/2001 |

* cited by examiner

*Primary Examiner* — Robert K Carpenter
(74) *Attorney, Agent, or Firm* — K&L Gates LLP

(57) ABSTRACT

A display device includes a substrate, a plurality of pixels provided to the substrate, a plurality of light emitting elements provided to each of the pixels, and a cathode electrode covering the light emitting elements. The light emitting elements each include a p-type cladding layer, an active layer, an n-type cladding layer, and a high-resistance layer stacked in order on the substrate, sheet resistance of the high-resistance layer is higher than sheet resistance of the n-type cladding layer, an upper surface of the n-type cladding layer has a plurality of recesses, and the cathode electrode covers the high-resistance layer and is directly coupled to the recesses and a peripheral part of the n-type cladding layer.

8 Claims, 13 Drawing Sheets

DISPLAY DEVICE

CROSS-REFERENCE TO RELATED APPLICATION

This application claims the benefit of priority from Japanese Patent Application No. 2020-105576 filed on Jun. 18, 2020, the entire contents of which are incorporated herein by reference.

BACKGROUND

1. Technical Field

The present disclosure relates to a display device.

2. Description of the Related Art

Display devices with micro light emitting diodes (micro LEDs) serving as display elements have been attracting attention (refer to U.S. Unexamined Patent Application Publication No. 2018/0198047 (US-A-2018-0198047, Japanese Patent Application Laid-open Publication No. H8-111544 (JP-A-H8-111544), and Japanese Patent Application Laid-open Publication No. 2001-144329 (JP-A-2001-144329). To increase the light extraction efficiency, the display devices with LEDs have a patterned sapphire substrate (PSS) structure (e.g., US-A-2018-0198047). Alternatively, the display devices with LEDs include a current blocking layer (high-resistance layer) between a surface electrode and a semiconductor layer (e.g., JP-A-H8-111544 and JP-A-2001-144329).

In such display devices, the viewing angle dependence of relative luminance may possibly increase, so that a peripheral part of the LED emits brighter light than a center part, for example.

SUMMARY

A display device according to an embodiment of the present disclosure includes a substrate, a plurality of pixels provided to the substrate, a plurality of light emitting elements provided to each of the pixels, and a cathode electrode covering the light emitting elements. The light emitting elements each include a p-type cladding layer, an active layer, an n-type cladding layer, and a high-resistance layer stacked in order on the substrate, sheet resistance of the high-resistance layer is higher than sheet resistance of the n-type cladding layer, an upper surface of the n-type cladding layer has a plurality of recesses, and the cathode electrode covers the high-resistance layer and is directly coupled to the recesses and a peripheral part of the n-type cladding layer.

DETAILED DESCRIPTION

Figure 1:
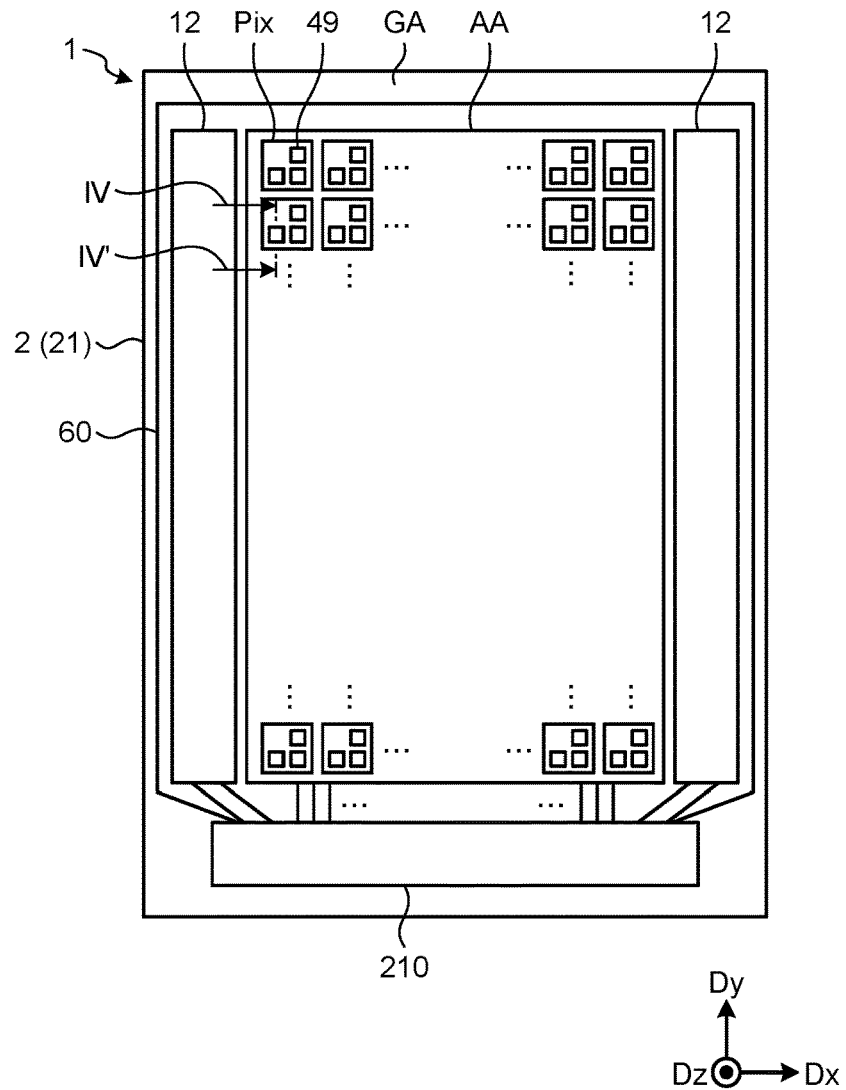
FIG. 1 is a plan view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

To describe an aspect where a first structure is disposed on a second structure in the present specification and the accompanying claims, the term "on" includes both of the following cases unless otherwise noted: a case where the first structure is disposed directly on the second structure in contact with the second structure and a case where the first structure is disposed on the second structure with another structure interposed therebetween.

First Embodiment

FIG. 1 is a plan view schematically illustrating a display device according to a first embodiment. As illustrated in FIG. 1, a display device 1 includes an array substrate 2, pixels Pix, drive circuits 12, a drive integrated circuit (IC) 210, and cathode wiring 60. The array substrate 2 is a drive circuit board for driving the pixels Pix and is also called a backplane or an active matrix substrate. The array substrate 2 includes a substrate 21, a plurality of transistors, a plurality of capacitances, and various kinds of wiring, for example.

As illustrated in FIG. 1, the display device 1 has a display region AA and a peripheral region GA. The display region AA is disposed overlapping the pixels Pix and displays an image. The peripheral region GA does not overlap the pixels Pix and is disposed outside the display region AA.

The pixels Pix are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation when viewed in the third direction Dz.

The drive circuits 12 drive a plurality of gate lines (e.g., a reset control signal line L5, an output control signal line L6, a pixel control signal line L7, and an initialization control signal line L8 (refer to FIG. 3)) based on various control signals supplied via wiring extending from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 1. A plurality of wires extend from the drive IC 210 toward the pixels Pix (e.g., a video signal line L2, a reset power supply line L3, and an initialization power supply line L4 (refer to FIG. 3)). The drive IC 210 is mounted on the peripheral region GA of the substrate 21 as chip on glass (COG). The mounting form is not limited thereto, and the drive IC 210 may be mounted on FPCs or a rigid substrate coupled to the peripheral region GA of the substrate 21 as chip on film (COF).

The cathode wiring 60 is provided in the peripheral region GA of the substrate 21. The cathode wiring 60 is provided surrounding the pixels Pix in the display region AA and the drive circuits 12 in the peripheral region GA. Cathodes of a plurality of light emitting elements 3 are coupled to the common cathode wiring 60 and supplied with a fixed potential (e.g., a ground potential). More specifically, a cathode terminal 32 (refer to FIG. 4) of the light emitting element 3 is coupled to the cathode wiring 60 via a cathode electrode 22.

Figure 2:
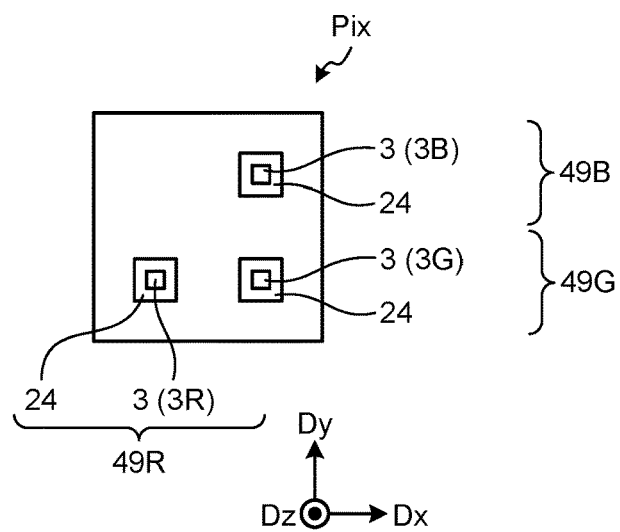
FIG. 2 is a plan view of a plurality of pixels.

FIG. 2 is a plan view of a plurality of pixels. As illustrated in FIG. 2, one pixel Pix includes a plurality of pixels 49. The pixel Pix includes a pixel 49R, a pixel 49G, and a pixel 49B, for example. The pixel 49R displays a primary color of red as the first color. The pixel 49G displays a primary color of green as the second color. The pixel 49B displays a primary color of blue as the third color. As illustrated in FIG. 2, the pixel 49R and the pixel 49G are disposed side by side in the first direction Dx in one pixel Pix. The pixel 49G and the pixel 49B are disposed side by side in the second direction Dy. The first color, the second color, and the third color are not limited to red, green, and blue, respectively, and may be any desired colors, such as complementary colors. In the following description, the pixel 49R, the pixel 49G, and the pixel 49B are referred to as pixels 49 when they need not be distinguished from one another.

The pixels 49 each include the light emitting element 3 and a first mounting electrode 24. The display device 1 displays an image by outputting different light from light emitting elements 3R, 3G, and 3B in the pixels 49R, 49G, and 49B, respectively. The light emitting element 3 is an inorganic light emitting diode (LED) chip having a size of approximately 3 μm to 300 μm in planar view and is called a micro LED. The display device 1 including the micro LEDs in the respective pixels is also called a micro LED display device. The term "micro" of the micro LED is not intended to limit the size of the light emitting element 3.

The light emitting elements 3 may output different light in four or more colors. The positions of the pixels 49 are not limited to those illustrated in FIG. 2. The pixel 49R, for example, may be disposed side by side with the pixel 49B in the second direction Dy. Alternatively, the pixel 49R, the pixel 49G, and the pixel 49B may be repeatedly arrayed in this order in the first direction Dx.

Figure 3:
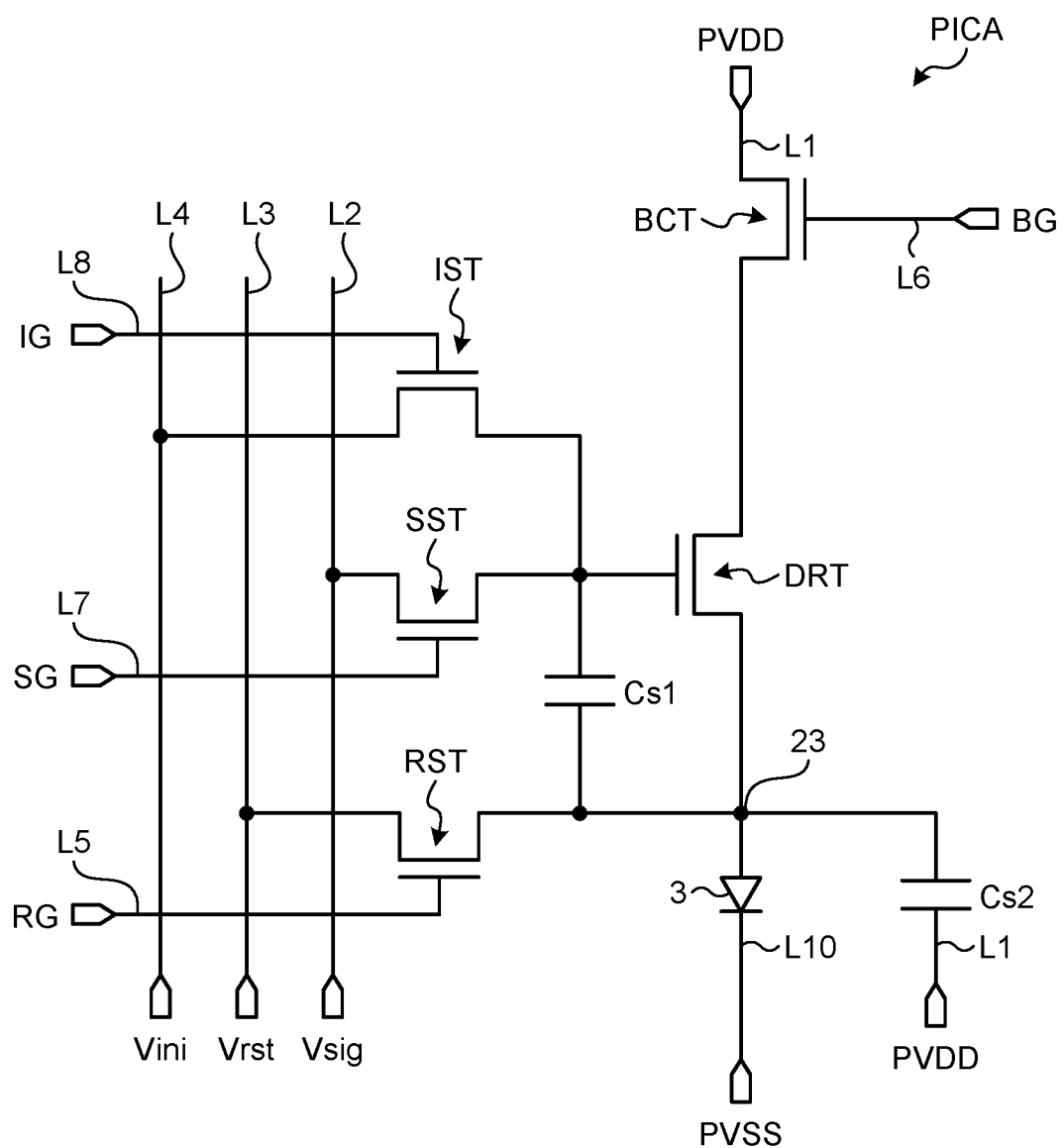
FIG. 3 is a circuit diagram of a pixel circuit.

FIG. 3 is a circuit diagram of a pixel circuit. FIG. 3 illustrates a pixel circuit PICA provided to one pixel 49. The pixel circuit PICA is provided to each of the pixels 49. As illustrated in FIG. 3, the pixel circuit PICA includes the light emitting element 3, five transistors, and two capacitances. Specifically, the pixel circuit PICA includes a drive transistor DRT, an output transistor BCT, an initialization transistor IST, a pixel selection transistor SST, and a reset transistor RST. The drive transistor DRT, the output transistor BCT, the initialization transistor IST, the pixel selection transistor SST, and the reset transistor RST are n-type thin-film transistors (TFTs). The pixel circuit PICA includes first capacitance Cs1 and second capacitance Cs2.

The cathode (cathode terminal 32) of the light emitting element 3 is coupled to a cathode power supply line L10. The anode (anode terminal 33) of the light emitting element 3 is coupled to an anode power supply line L1 via the drive transistor DRT and the output transistor BCT. The anode power supply line L1 is supplied with an anode power supply potential PVDD. The cathode power supply line L10 is supplied with a cathode power supply potential PVSS via the cathode wiring 60 and the cathode electrode 22. The anode power supply potential PVDD is higher than the cathode power supply potential PVSS.

The anode power supply line L1 supplies the anode power supply potential PVDD serving as a drive potential to the pixel 49. Specifically, the light emitting element 3 ideally emits light by being supplied with a forward current (drive current) by a potential difference (PVDD-PVSS) between the anode power supply potential PVDD and the cathode power supply potential PVSS. In other words, the anode power supply potential PVDD has a potential difference to cause the light emitting element 3 to emit light with respect to the cathode power supply potential PVSS. The anode terminal 33 of the light emitting element 3 is electrically coupled to an anode electrode 23. The second capacitance Cs2 serving as an equivalent circuit is coupled between the anode electrode 23 and the anode power supply line L1.

The source electrode of the drive transistor DRT is coupled to the anode terminal 33 of the light emitting element 3 via the anode electrode 23, and the drain electrode thereof is coupled to the source electrode of the output transistor BCT. The gate electrode of the drive transistor DRT is coupled to the first capacitance Cs1, the drain electrode of the pixel selection transistor SST, and the drain electrode of the initialization transistor IST.

The gate electrode of the output transistor BCT is coupled to the output control signal line L6. The output control signal line L6 is supplied with an output control signal BG. The drain electrode of the output transistor BCT is coupled to the anode power supply line L1.

The source electrode of the initialization transistor IST is coupled to an initialization power supply line L4. The initialization power supply line L4 is supplied with an initialization potential Vini. The gate electrode of the initialization transistor IST is coupled to the initialization control signal line L8. The initialization control signal line L8 is supplied with an initialization control signal IG. In other words, the gate electrode of the drive transistor DRT is coupled to the initialization power supply line L4 via the initialization transistor IST.

The source electrode of the pixel selection transistor SST is coupled to a video signal line L2. The video signal line L2 is supplied with a video signal Vsig. The gate electrode of the pixel selection transistor SST is coupled to the pixel control signal line L7. The pixel control signal line L7 is supplied with a pixel control signal SG.

The source electrode of the reset transistor RST is coupled to a reset power supply line L3. The reset power supply line L3 is supplied with a reset power supply potential Vrst. The gate electrode of the reset transistor RST is coupled to the reset control signal line L5. The reset control signal line L5 is supplied with a reset control signal RG. The drain electrode of the reset transistor RST is coupled to the anode electrode 23 (anode terminal 33 of the light emitting element 3) and the source electrode of the drive transistor DRT. A reset operation performed by the reset transistor RST resets the voltage held in the first capacitance Cs1 and the second capacitance Cs2.

The first capacitance Cs1 serving as an equivalent circuit is provided between the drain electrode of the reset transistor RST and the gate electrode of the drive transistor DRT. The pixel circuit PICA can prevent fluctuations in the gate voltage due to parasitic capacitance and current leakage in the drive transistor DRT by the first capacitance Cs1 and the second capacitance Cs2.

In the following description, the anode power supply line L1 and the cathode power supply line L10 may be simply referred to as power supply lines. The video signal line L2, the reset power supply line L3, and the initialization power supply line L4 may be referred to as signal lines. The reset control signal line L5, the output control signal line L6, the pixel control signal line L7, and the initialization control signal line L8 may be referred to as gate lines.

The gate electrode of the drive transistor DRT is supplied with an electric potential corresponding to the video signal Vsig (or gradation signal). In other words, the drive transistor DRT supplies an electric current corresponding to the video signal Vsig to the light emitting element 3 based on the anode power supply potential PVDD supplied via the output transistor BCT. As described above, the anode power supply potential PVDD supplied to the anode power supply line L1 is lowered by the drive transistor DRT and the output transistor BCT. As a result, an electric potential lower than the anode power supply potential PVDD is supplied to the anode terminal 33 of the light emitting element 3.

A first electrode of the second capacitance Cs2 is supplied with the anode power supply potential PVDD via the anode power supply line L1, and a second electrode of the second capacitance Cs2 is supplied with an electric potential lower than the anode power supply potential PVDD. In other words, the first electrode of the second capacitance Cs2 is supplied with an electric potential higher than that supplied to the second electrode of the second capacitance Cs2. The first electrode of the second capacitance Cs2 is a counter electrode 26 coupled to the anode power supply line L1 illustrated in FIG. 4, for example. The second electrode of the second capacitance Cs2 is the anode electrode 23 coupled to the source of the drive transistor DRT illustrated in FIG. 4.

In the display device 1, the drive circuits 12 (illustrated in FIG. 1) select a plurality of pixel rows in order from the first row (e.g., the uppermost pixel row in the display region AA in FIG. 1). The drive IC 210 writes the video signals Vsig (video writing potential) to the pixels 49 of the selected pixel row, thereby causing the light emitting elements 3 to emit light. The drive IC 210 supplies the video signals Vsig to the video signal line L2, supplies the reset power supply potential Vrst to the reset power supply line L3, and supplies the initialization potential Vini to the initialization power supply line L4 in each horizontal scanning period. The display device 1 repeats these operations in units of an image of one frame.

Figure 4:
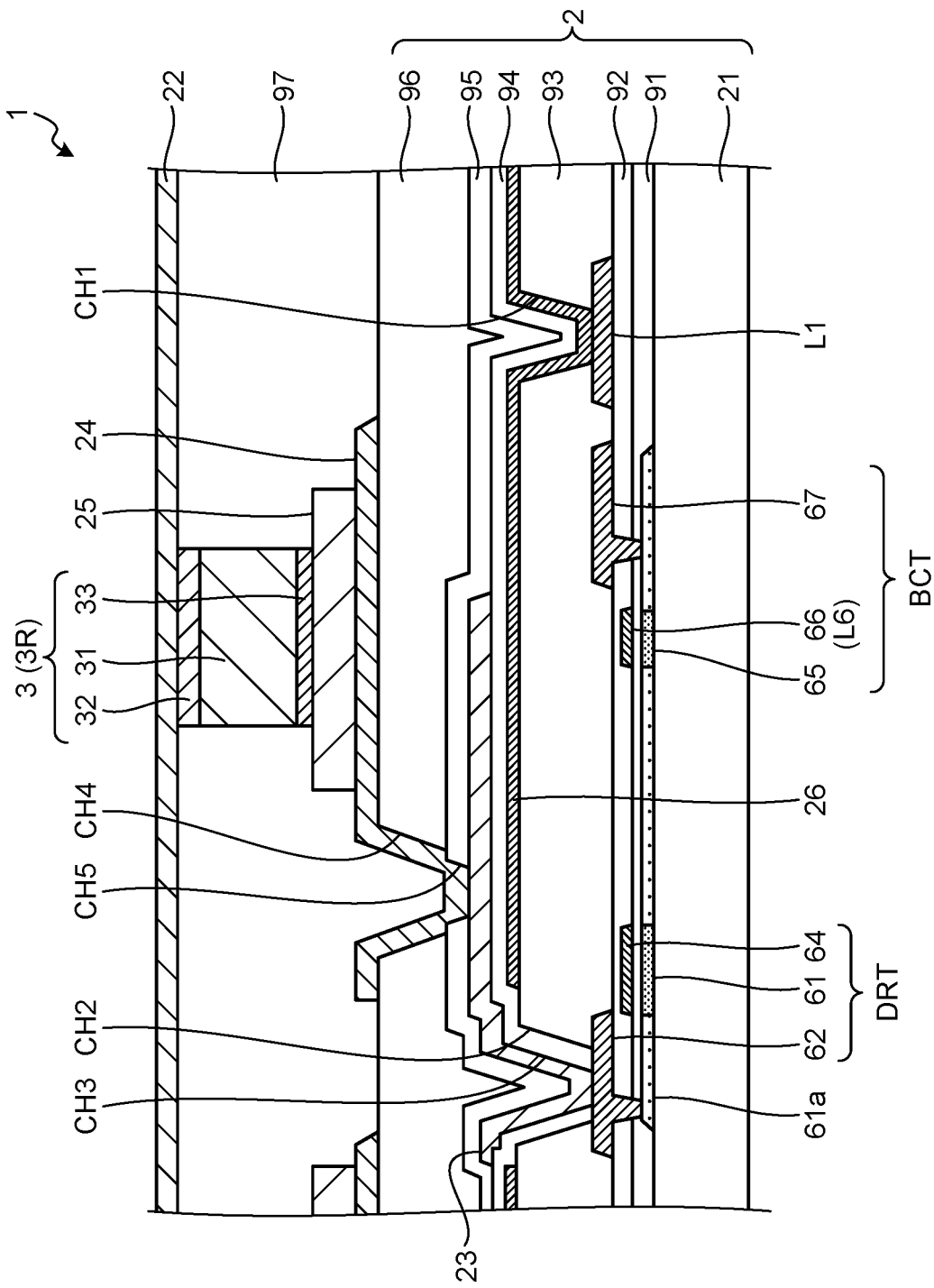
FIG. 4 is a sectional view along line IV-IV' of FIG. 1.

The following describes a sectional configuration of the display device 1. FIG. 4 is a sectional view along line IV-IV' of FIG. 1. As illustrated in FIG. 4, the light emitting element 3 is provided on the array substrate 2. The array substrate 2 includes the substrate 21, various transistors, various kinds of wiring, and various insulating films. The substrate 21 is an insulating substrate and is a glass substrate, a resin substrate, or a resin film, for example.

In the present specification, a direction from the substrate 21 toward the light emitting element 3 in a direction perpendicular to the surface of the substrate 21 is referred to as "upper side" or simply as "up". A direction from the light emitting element 3 toward the substrate 21 is referred to as "lower side" or simply as "down".

The drive transistor DRT and the output transistor BCT are provided on a first surface of the substrate 21. Semiconductor layers 61 and 65 are provided on the substrate 21. An undercoat film may be provided between the semiconductor layers 61 and 65 and the substrate 21. An insulating film 91 is provided on the substrate 21 to cover the semiconductor layers 61 and 65. The insulating film 91 is a silicon oxide film, for example.

Gate electrodes 64 and 66 are provided on the insulating film 91. In the example illustrated in FIG. 4, the transistors have what is called a top-gate structure. The transistors may have a bottom-gate structure in which the gate electrode is provided under the semiconductor layer. Alternatively, the transistors may have a dual-gate structure in which the gate electrodes are provided both on and under the semiconductor layer.

An insulating film 92 is provided on the insulating film 91 to cover the gate electrodes 64 and 66. The insulating film 92 has a multilayered structure composed of a silicon nitride film and a silicon oxide film, for example. A source electrode 62, a drain electrode 67, and the anode power supply line L1 are provided on the insulating film 92. The source electrode 62 is electrically coupled to the semiconductor layer 61 through a contact hole passing through the insulating films 91 and 92. The drain electrode 67 is electrically coupled to the semiconductor layer 65 through a contact hole formed in the insulating films 91 and 92.

A plurality of insulating films (a first organic insulating film 93, an insulating film 94, an insulating film 95, and a second organic insulating film 96) are provided covering the transistors. The first organic insulating film 93 and the second organic insulating film 96 are made of organic material, such as photosensitive acrylic. The organic material, such as photosensitive acrylic, is excellent in coverability for covering a difference in level of wiring and flatness on the surface compared with inorganic insulating material formed by CVD, for example. The insulating films 94 and 95 are inorganic insulating films and may be made of the same material as that of the insulating films 91 and 92, such as a silicon nitride film.

Specifically, the first organic insulating film 93 is provided on the insulating film 92 to cover the source electrode 62, the drain electrode 67, and the anode power supply line L1. The counter electrode 26, the insulating film 94, and the anode electrode 23 are stacked in order on the first organic insulating film 93. The counter electrode 26 is made of translucent conductive material, such as indium tin oxide (ITO). The counter electrode 26 is coupled to the anode power supply line L1 at the bottom of a contact hole CH1 formed in the first organic insulating film 93.

The insulating film 94 is provided covering the counter electrode 26. The anode electrode 23 faces the counter electrode 26 with the insulating film 94 interposed therebetween. The first organic insulating film 93 and the insulating film 94 have contact holes CH2 and CH3 the bottom surface of which is the source electrode 62. The anode electrode 23 is electrically coupled to the source electrode 62 through the contact holes CH2 and CH3. As a result, the anode electrode 23 is electrically coupled to the drive transistor DRT.

The anode electrode 23 has a multilayered structure composed of titanium (Ti) and aluminum (Al), for example. The material of the anode electrode 23 is not limited thereto, and the anode electrode 23 may be made of material including at least one of metals of molybdenum (Mo) and Ti. Alternatively, the anode electrode 23 may be made of alloy including at least one of Mo and Ti or translucent conductive material. The second capacitance Cs2 is formed between the anode electrode 23 and the counter electrode 26 facing with the insulating film 94 interposed therebetween.

The insulating film 95 is provided on the insulating film 94 to cover the anode electrode 23. The second organic insulating film 96 is provided on the insulating film 95. In other words, the first organic insulating film 93 is provided on the drive transistor DRT, and the second organic insulating film 96 is stacked on the first organic insulating film 93. The insulating film 95 is provided between the first organic insulating film 93 and the second organic insulating film 96. The second organic insulating film 96 has a contact hole CH4. The insulating film 95 has a contact hole CH5 overlapping the contact hole CH4. The bottom of the contact holes CH4 and CH5 is provided with the anode electrode 23. The anode electrode 23 is provided facing at least part of the first mounting electrode 24.

The first mounting electrode 24 is provided on the second organic insulating film 96 and electrically coupled to the anode electrode 23 through the contact holes CH4 and CH5. The first mounting electrode 24 has a multilayered structure of Ti and Al like the anode electrode 23. The first mounting electrode 24 may be made of conductive material different from that of the anode electrode 23. The second organic insulating film 96 may be made of organic material different from that of the first organic insulating film 93.

The light emitting elements 3R, 3G, and 3B are mounted on the respective first mounting electrodes 24. The light emitting elements 3 are each mounted such that the anode terminal 33 is in contact with the first mounting electrode 24. A connection member 25 between the anode terminal 33 of the light emitting element 3 and the first mounting electrode 24 may be made of any desired material as long as it can secure satisfactory electrical continuity between the anode terminal 33 and the first mounting electrode 24 and does not damage objects on the array substrate 2. The connection member 25 is made of solder or conductive paste, for example. Examples of the method for connecting the anode terminal 33 and the first mounting electrode 24 include, but are not limited to, reflowing using low-temperature melting soldering material, placing the light emitting element 3 on the array substrate 2 with conductive paste interposed therebetween and burning and bonding them, etc.

The light emitting element 3 may be mounted directly on the anode electrode 23 without the second organic insulating film 96 or the first mounting electrode 24 on the array substrate 2. Providing the second organic insulating film 96 and the first mounting electrode 24 can prevent the insulating film 94 from being damaged by force applied in mounting the light emitting element 3. In other words, the second organic insulating film 96 and the first mounting electrode 24 can prevent dielectric breakdown between the anode electrode 23 and the counter electrode 26 that form the capacitance Cs2.

The light emitting element 3 is a face-up light emitting element. The lower part of the light emitting element 3 is electrically coupled to the anode electrode 23, and the upper part the light emitting element 3 is coupled to the cathode electrode 22. The light emitting element 3 includes a semiconductor layer 31, the cathode terminal 32, and the anode terminal 33. The semiconductor layer 31 has a multilayered structure composed of an n-type cladding layer 37, an active layer 36, and a p-type cladding layer 35 (refer to FIG. 5). The semiconductor layer 31 is made of a compound semiconductor, such as gallium nitride (GaN), aluminum indium phosphorous (AlInP), and indium gallium nitride (InGaN). The semiconductor layer 31 may be made of different materials depending on the light emitting elements 3R, 3G, and 3B. The active layer may have a multi-quantum well structure (MQW structure) in which well layers and barrier layers composed of several atomic layers are cyclically stacked for high efficiency. In the light emitting element 3, the semiconductor layer 31 may be formed on a semiconductor substrate. The side walls of the light emitting element 3 may be covered with a protective insulating film (e.g., silicon nitride (SiN) or aluminum oxide ($Al_2O_3$)).

An element insulating film 97 is provided between a plurality of light emitting elements 3. The element insulating film 97 is made of resin material. The element insulating film 97 covers the side surfaces of the light emitting element 3, and the cathode terminal 32 of the light emitting element 3 is exposed from the element insulating film 97. The element insulating film 97 is flatly formed such that the upper surface of the element insulating film 97 and the upper surface of the cathode terminal 32 produce a single plane. The position of the upper surface of the element insulating film 97 may be different from that of the upper surface of the cathode terminal 32.

The cathode electrode 22 covers a plurality of light emitting elements 3 and the element insulating film 97 and is electrically coupled to the light emitting elements 3. The cathode electrode 22 is made of translucent conductive material, such as ITO. This configuration can efficiently extract light output from the light emitting elements 3 to the outside. The cathode electrode 22 is electrically coupled to the cathode terminals 32 of the light emitting elements 3 mounted on the display region AA. The cathode electrode 22 is coupled to the cathode wiring 60 provided on the array substrate 2 at a contact part provided outside the display region AA.

As described above, the display device 1 including the light emitting elements 3 serving as display elements is provided. In the display device 1, an overcoat layer and a cover substrate may be stacked on the cathode electrode 22 as needed. The display device 1 may further include a circularly polarizing plate, a touch panel, and other components on the cathode electrode 22.

Figure 5:
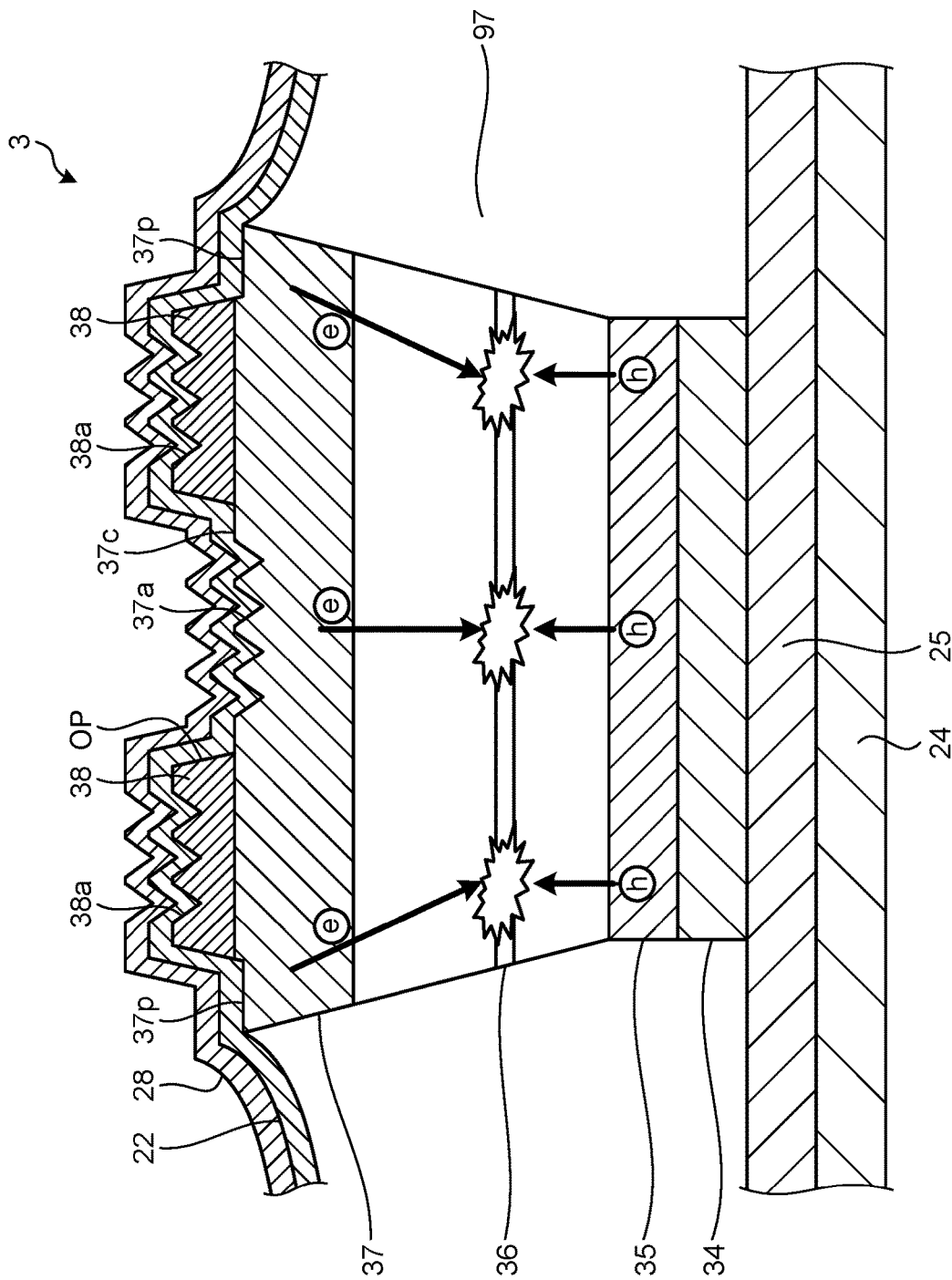
FIG. 5 is a sectional view schematically illustrating a light emitting element.

The following describes the configuration of the light emitting element 3 in greater detail. FIG. 5 is a sectional view schematically illustrating the light emitting element.

Figure 6:
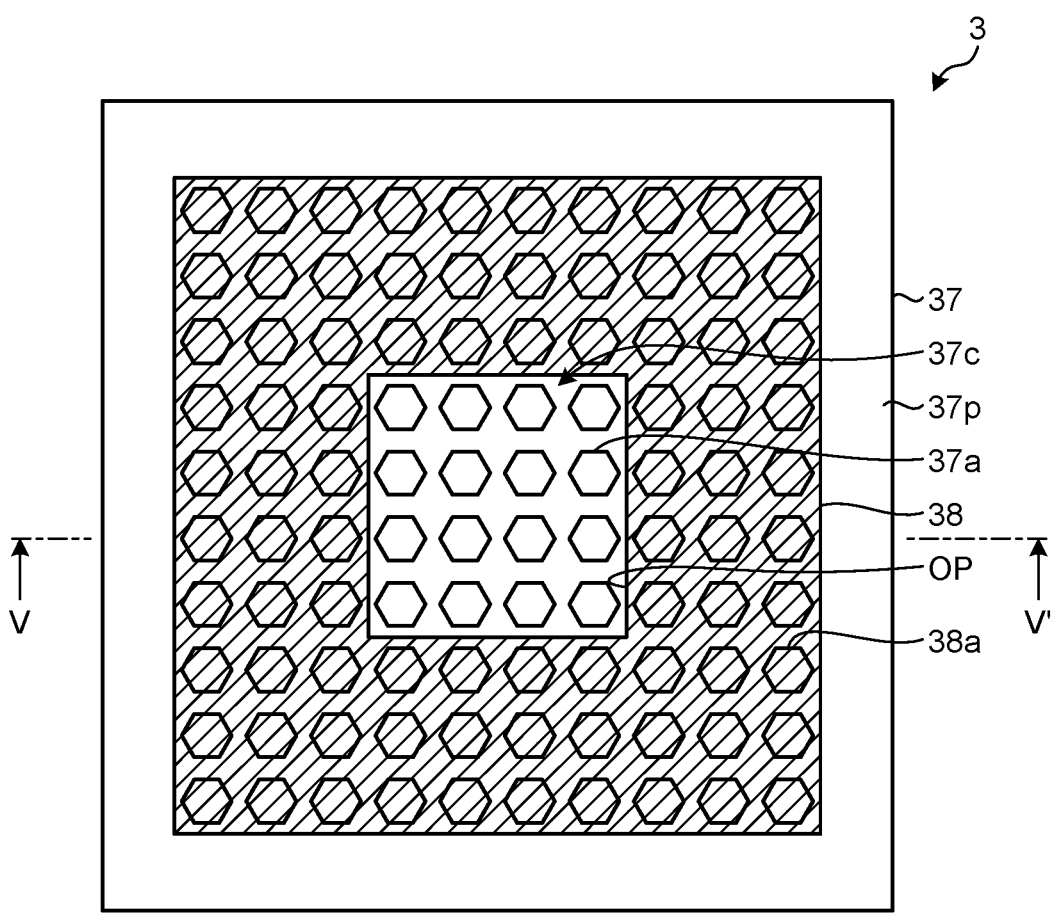
FIG. 6 is a plan view schematically illustrating the light emitting element.

FIG. 6 is a plan view schematically illustrating the light emitting element. FIG. 5 is a sectional view along line V-V' of FIG. 6. In FIG. 6, a region provided with a high-resistance layer 38 is hatched.

As illustrated in FIG. 5, in the light emitting element 3, a p-type electrode 34, the p-type cladding layer 35, the active layer 36, and the n-type cladding layer 37 are stacked in order on the first mounting electrode 24 and the connection member 25. The light emitting element 3 further includes the high-resistance layer 38 stacked on the n-type cladding layer 37. The high-resistance layer 38 is made of gallium nitride (GaN) doped with no impurities, for example. The sheet resistance of the high-resistance layer 38 is higher than that of the n-type cladding layer 37.

As illustrated in FIG. 6, the outer shape of the n-type cladding layer 37 and the high-resistance layer 38 is a square in planar view. The outer shape of the n-type cladding layer 37 and the high-resistance layer 38 is not limited thereto and may be other shapes, such as rectangular, polygonal, and circular shapes.

As illustrated in FIGS. 5 and 6, the outer shape of the high-resistance layer 38 is smaller than that of the n-type cladding layer 37. In other words, the high-resistance layer 38 is not stacked on a peripheral part 37p of the n-type cladding layer 37. The high-resistance layer 38 has an opening OP and has a frame shape in planar view. The cathode electrode 22 is provided covering the high-resistance layer 38 and the n-type cladding layer 37. The cathode electrode 22 is directly coupled to the n-type cladding layer 37 in the peripheral part 3'7p of the upper surface of the n-type cladding layer 37. In addition, the cathode electrode 22 is directly coupled to a center part 37c of the n-type cladding layer 37 through the opening OP of the high-resistance layer 38. The side walls of the light emitting element 3 may be covered with a protective insulating film (e.g., SiN or $Al_2O_3$).

In other words, the center part 37c and the peripheral part 37p of the upper surface of the n-type cladding layer 37 function as the cathode terminal 32 (refer to FIG. 4). The p-type cladding layer 35, the active layer 36, and the n-type cladding layer 37 correspond to the semiconductor layer 31 (refer to FIG. 4). The p-type electrode 34 corresponds to the anode terminal 33 (refer to FIG. 4).

As described above, the cathode electrode 22 covers the high-resistance layer 38 and is directly coupled to the n-type cladding layer 37 not via the high-resistance layer 38 in the center part 37c and the peripheral part 37p of the n-type cladding layer 37. With this configuration, the cathode power supply potential PVSS is supplied to the peripheral part 37p of the n-type cladding layer 37 and the center part 37c of the n-type cladding layer 37. Consequently, one light emitting element 3 has current paths not only in the peripheral part 3'7p but also in the center part 37c compared with a configuration where the high-resistance layer 38 does not have the opening OP and covers the center part 37c. As a result, the light emitting element 3 satisfactorily emits light not only near the peripheral part 37p but also in the center part 37c. Consequently, the present embodiment can reduce the difference in relative luminance between the peripheral part 37p and the center part 37c and improve the emission distribution characteristics. The emission distribution characteristics according to the present embodiment indicates the viewing angle dependence of relative luminance (refer to FIG. 8).

The cathode electrode 22 is coupled to the center part 37c and the peripheral part 37p of the n-type cladding layer 37. This configuration can increase the number of coupling parts and the coupling area between the cathode electrode 22 and the n-type cladding layer 37 compared with the configuration where the high-resistance layer 38 does not have the opening OP. Consequently, the present embodiment can secure coupling of the cathode of the light emitting element 3.

An insulating film 28 is provided covering the cathode electrode 22. The insulating film 28 is provided as a protective film for the cathode electrode 22. The insulating film 28 is an inorganic insulating film and is made of SiN or $Al_2O_3$, for example.

The refractive index of the insulating film 28 and the refractive index of the cathode electrode 22 are lower than that of the n-type cladding layer 37. The refractive index of the n-type cladding layer 37 is approximately 2.4, for example. The refractive index of the cathode electrode 22 is approximately 1.5 to 1.9, for example. The refractive index of the insulating film 28 is approximately 1.55 to 1.75, for example.

The difference in the refractive index between the layers is smaller than that between the n-type cladding layer 37 (GaN) and air (the refractive index of which is 1). This configuration can increase the critical angle that yields total reflection on the interface between the layers compared with a case where GaN is provided in contact with air. Consequently, the display device 1 can prevent light output from the light emitting element 3 from being totally reflected by the interface between the layers. As a result, the display device 1 can increase the light extraction efficiency of the light emitting element 3.

As illustrated in FIGS. 5 and 6, the upper surface of the n-type cladding layer 37 has a plurality of recesses 37a. The recesses 37a are formed in the center part 37c of the n-type cladding layer 37 and are not formed in the peripheral part 37p. The upper surface of the high-resistance layer 38 has a plurality of recesses 38a. The recesses 37a and 38a are formed by transferring the shape of the surface of a sapphire substrate (support substrate 200, refer to FIG. 9) having a patterned sapphire substrate (PSS) structure. The recesses 37a and 38a have a hexagonal pyramid shape. In other words, the recesses 37a and 38a each have a hexagonal opening shape in planar view and a tapered shape with inclining side walls. With the recesses 37a and 38a, the light emitting element 3 can prevent reflection of external light, thereby reducing deterioration of display quality.

The recesses 37a and 38a do not necessarily have a hexagonal pyramid shape and may have other shapes, such as a cone and a triangular pyramid. The recesses 37a and 38a are arrayed in a matrix (row-column configuration) in planar view. The recesses 37a and 38a are not necessarily arrayed in a matrix and may be arrayed in other patterns, such as a triangular lattice.

Figure 7:
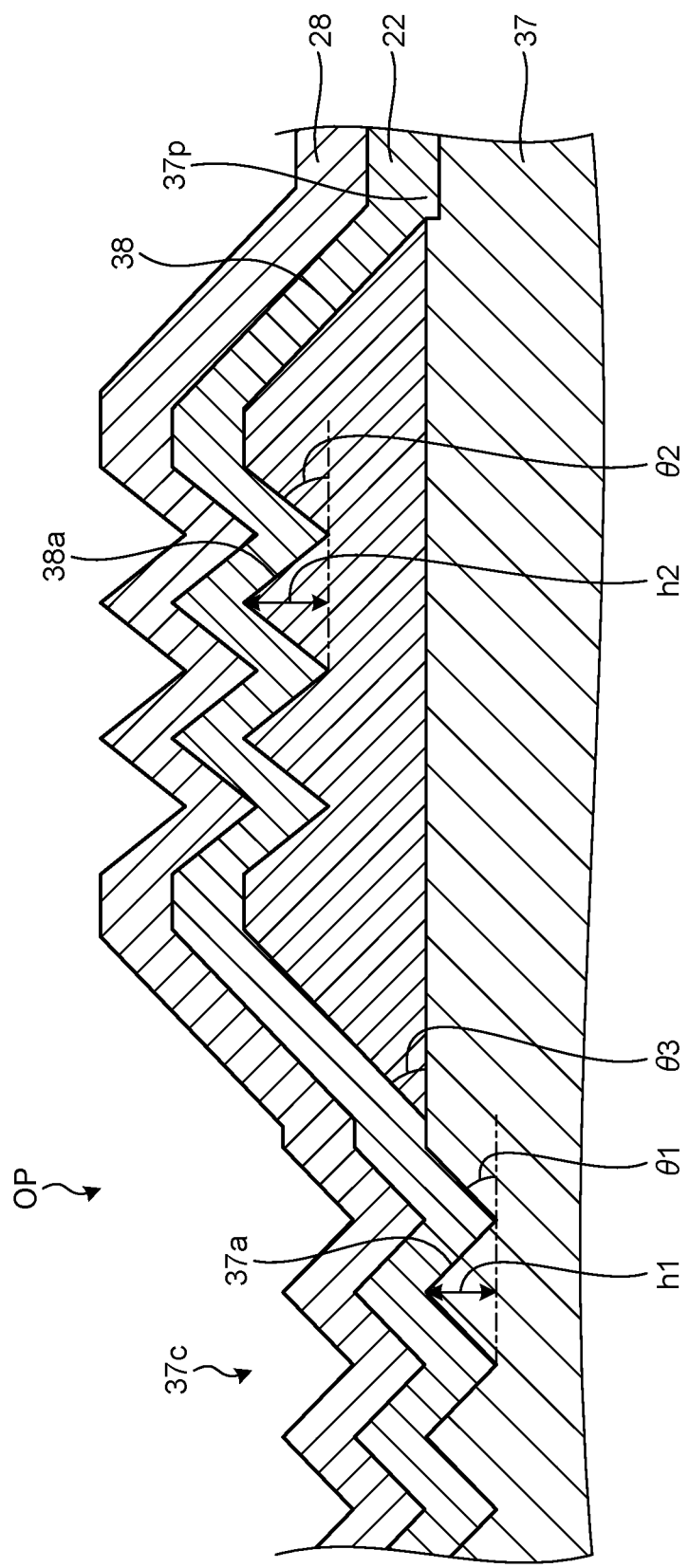
FIG. 7 is an enlarged sectional view of an n-type cladding layer and a high-resistance layer.

FIG. 7 is an enlarged sectional view of the n-type cladding layer and the high-resistance layer. As illustrated in FIG. 7, an inclination angle (angle θ1) of the side wall of the recess 37a in the center part 37c of the n-type cladding layer 37 is equal to or smaller than an inclination angle (angle θ2) of the side wall of the recess 38a on the upper surface of the high-resistance layer 38. In other words, the angle θ1 formed by the side wall of the recess 37a and the direction parallel to the substrate 21 in the center part 37c of the n-type cladding layer 37 is equal to or smaller than the angle θ2 formed by the side wall of the recess 38a and the direction parallel to the substrate 21 on the upper surface of the high-resistance layer 38. A height h1 of the recess 37a in the center part 37c of the n-type cladding layer 37 is equal to or lower than a height h2 of the recess 38a on the upper surface of the high-resistance layer 38. With this structure, the light emitting element 3 can increase the light extraction efficiency in the center part 37c of the n-type cladding layer 37.

An angle θ3 formed by the side wall of the high-resistance layer 38 surrounding the opening OP and the direction parallel to the substrate 21 is smaller than the angles θ1 and θ2. An angle of the side wall of the high-resistance layer 38 adjacent to the peripheral part 37p of the n-type cladding layer 37 is also smaller than the angles θ1 and θ2. This structure can prevent step disconnection of the cathode electrode 22 and the insulating film 28 covering the high-resistance layer 38.

The configuration of the light emitting element 3 may be appropriately modified. The shape and the position of the high-resistance layer 38, for example, is not limited to the frame shape illustrated in FIGS. 5 and 6. Alternatively, a plurality of high-resistance layers 38 may be disposed in a manner separated from one another. The ratio of the area of the opening OP to the area of the high-resistance layer 38 is given by way of example only. The ratio may be appropriately modified corresponding to the emission distribution characteristics required for the light emitting element 3.

Figure 8:
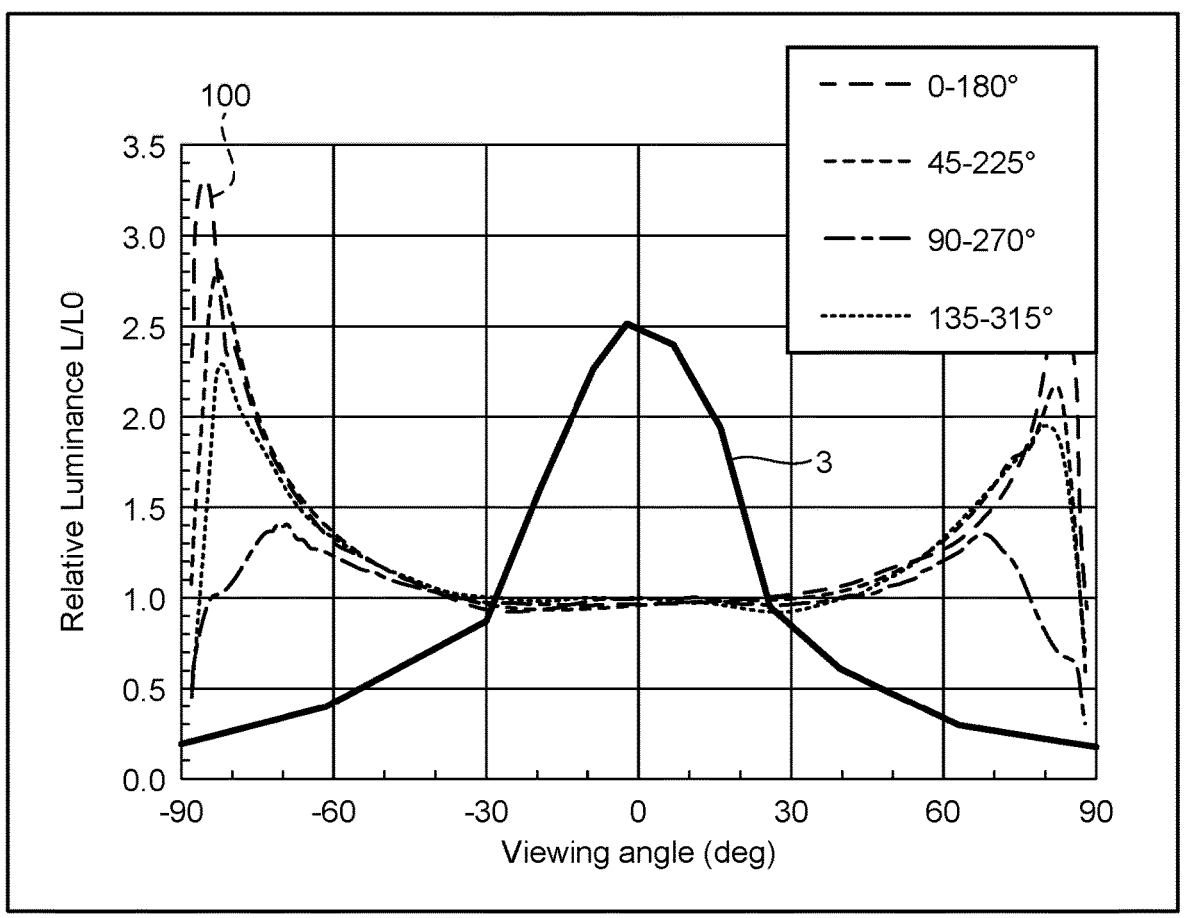
FIG. 8 is a graph of the emission distribution characteristics of the light emitting element according to the embodiment and the light emitting element according to a comparative example.

FIG. 8 is a graph of the emission distribution characteristics of the light emitting element according to the embodiment and the light emitting element according to a comparative example. In the graph illustrated in FIG. 8, the axis of ordinate indicates relative luminance, and the axis of abscissa indicates viewing angle. The viewing angle indicates an angle (polar angle) with respect to the third direction Dz. In a light emitting element 100 according to the comparative example in FIG. 8, the high-resistance layer 38 does not have the opening OP, and the cathode electrode 22 is coupled to the peripheral part 37p of the n-type cladding layer 37 and is not coupled to the center part 37c. The light emitting element 100 according to the comparative example shows emission distribution characteristics varying depending on different azimuths.

As illustrated in FIG. 8, the light emitting element 100 according to the comparative example has a peak of the relative luminance at high viewing angles and has low relative luminance at a viewing angle of 0° (third direction Dz). By contrast, the light emitting element 3 according to the embodiment has a peak of the relative luminance at a viewing angle of 0° (third direction Dz). The results showed that the light extraction efficiency in the third direction Dz is improved.

Figure 9:
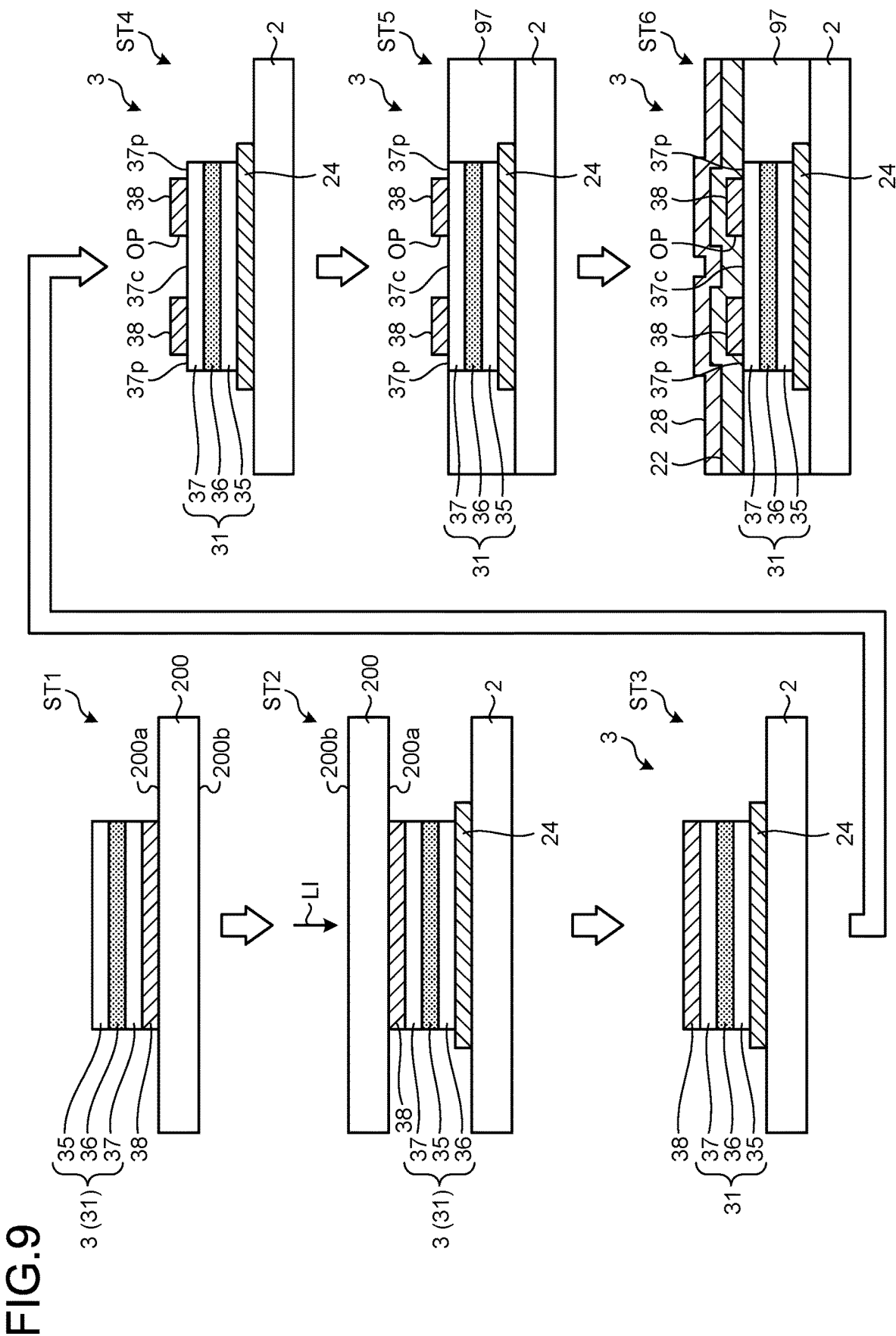
FIG. 9 is a view for explaining a method for manufacturing the display device according to the first embodiment.

The following describes a method for manufacturing the display device 1. FIG. 9 is a view for explaining the method for manufacturing the display device according to the first embodiment. To facilitate the reader's understanding, FIG. 9 illustrates one light emitting element 3. In an actual manufacturing process, a number of light emitting elements 3 are simultaneously mounted on the array substrate 2.

As illustrated in FIG. 9, a manufacturing apparatus forms the semiconductor layer 31 on a first surface 200a of a support substrate 200 (Step ST1). Specifically, the manufacturing apparatus forms the high-resistance layer 38, the n-type cladding layer 37, the active layer 36, and the p-type cladding layer 35 in order on the first surface 200a of the support substrate 200. The support substrate 200 is a sapphire substrate, for example, and has a PSS structure on the first surface 200a. The high-resistance layer 38 is made of amorphous GaN, for example. Providing the high-resistance layer 38 can reduce stress generated between the support substrate 200 and the semiconductor layer 31 compared with a case where the semiconductor layer 31 is directly provided on the support substrate 200.

Subsequently, the manufacturing apparatus disposes the first surface 200a of the support substrate 200 so as to face the array substrate 2. The first mounting electrode 24, the connection member 25, and the p-type electrode 34 are stacked in order on the surface of the array substrate 2. FIG. 9 does not illustrate the connection member 25 or the p-type electrode 34. The manufacturing apparatus brings the p-type cladding layer 35 of the semiconductor layer 31 into contact with the first mounting electrode 24. A laser device irradiates the semiconductor layer 31 with laser light LI (Step ST2).

The laser light LI is output toward a second surface 200b of the support substrate 200 and reaches the semiconductor layer 31. The semiconductor layer 31 is irradiated with the laser light LI, absorbs the light, is separated (detached) from the support substrate 200, and is stacked on the surface of the array substrate 2 (Step ST3). In other words, the manufacturing apparatus detaches the semiconductor layer 31 from the support substrate 200 by a laser lift-off technology. The high-resistance layer 38 and the n-type cladding layer 37 have a plurality of recesses 38a and 37a (refer to FIG. 5), which are not illustrated in FIG. 9, formed by transferring the PSS structure of the support substrate 200.

The laser light LI is preferably set to a wavelength band in which the laser light LI passes through the support substrate 200 and is absorbed by the n-type cladding layer 37 of the semiconductor layer 31. The laser light LI preferably has an energy of 3.5 eV (electron Volt) to 9.9 eV corresponding to a wavelength band in which the laser light LI passes through sapphire but does not pass through GaN, for example. The wavelength of the laser light LI is preferably set to 310 nm or lower.

Subsequently, the manufacturing apparatus patterns the high-resistance layer 38 (Step ST4). To pattern the high-resistance layer 38, a resist is formed by photolithography, and a center part and a peripheral part of the high-resistance layer 38 are removed by dry etching, for example. As a result, the opening OP of the high-resistance layer 38 is formed, and the center part 37c and the peripheral part 37p of the n-type cladding layer 37 are exposed. Reactive ion etching (hereinafter, referred to as RIE) can be employed as dry etching.

Subsequently, the manufacturing apparatus forms the element insulating film 97 between the light emitting elements 3 (Step ST5). The element insulating film 97 covers the side surfaces of the p-type cladding layer 35, the active layer 36, and the n-type cladding layer 37. The element insulating film 97 does not overlap the upper surface (the center part 37c and the peripheral part 37p) of the n-type cladding layer 37 and the high-resistance layer 38.

The manufacturing apparatus forms the cathode electrode 22 and the insulating film 28 to cover the light emitting element 3 and the element insulating film 97 (Step ST6). As a result, the cathode electrode 22 covers the high-resistance layer 38 and is directly in contact with the center part 37c and the peripheral part 37p of the n-type cladding layer 37.

By the process described above, the light emitting element 3 can be transferred and mounted on the array substrate 2 to manufacture the display device 1. The manufacturing method illustrated in FIG. 9 is given by way of example only and may be appropriately modified.

As described above, the display device 1 according to the present embodiment includes the substrate 21, a plurality of pixels Pix, a plurality of light emitting elements 3, and the cathode electrode 22. The pixels Pix are provided to the substrate 21. The light emitting elements 3 are provided to each of the pixels Pix. The cathode electrode 22 covers the light emitting elements 3. The light emitting element 3 includes the p-type cladding layer 35, the active layer 36, the n-type cladding layer 37, and the high-resistance layer 38 stacked in order on the substrate 21. The sheet resistance of the high-resistance layer 38 is higher than that of the n-type cladding layer 37. The cathode electrode 22 covers the high-resistance layer 38 and is directly coupled to the center part 37c and the peripheral part 37p of the n-type cladding layer 37.

In the display device 1 according to the present embodiment, the outer shape of the high-resistance layer 38 is smaller than that of the n-type cladding layer 37, and the high-resistance layer 38 has the opening OP. The cathode electrode 22 is coupled to the peripheral part 37p of the n-type cladding layer 37 positioned on the outer side than the high-resistance layer 38 and to the center part 37c of the n-type cladding layer 37 through the opening OP of the high-resistance layer 38.

With this configuration, one light emitting element 3 has not only a current path passing through the peripheral part 37p and the p-type cladding layer but also a current path passing through the center part 37c and the p-type cladding layer. As a result, the light emitting element 3 satisfactorily emits light not only near the peripheral part 37p but also in the center part 37c, thereby reducing the difference in relative luminance between the peripheral part 37p and the center part 37c. Consequently, the present embodiment can improve the emission distribution characteristics by preventing the peripheral part 37p of the light emitting element 3 from emitting brighter light or preventing the center part 37c of the light emitting element 3 from emitting brighter light.

Second Embodiment

Figure 10:
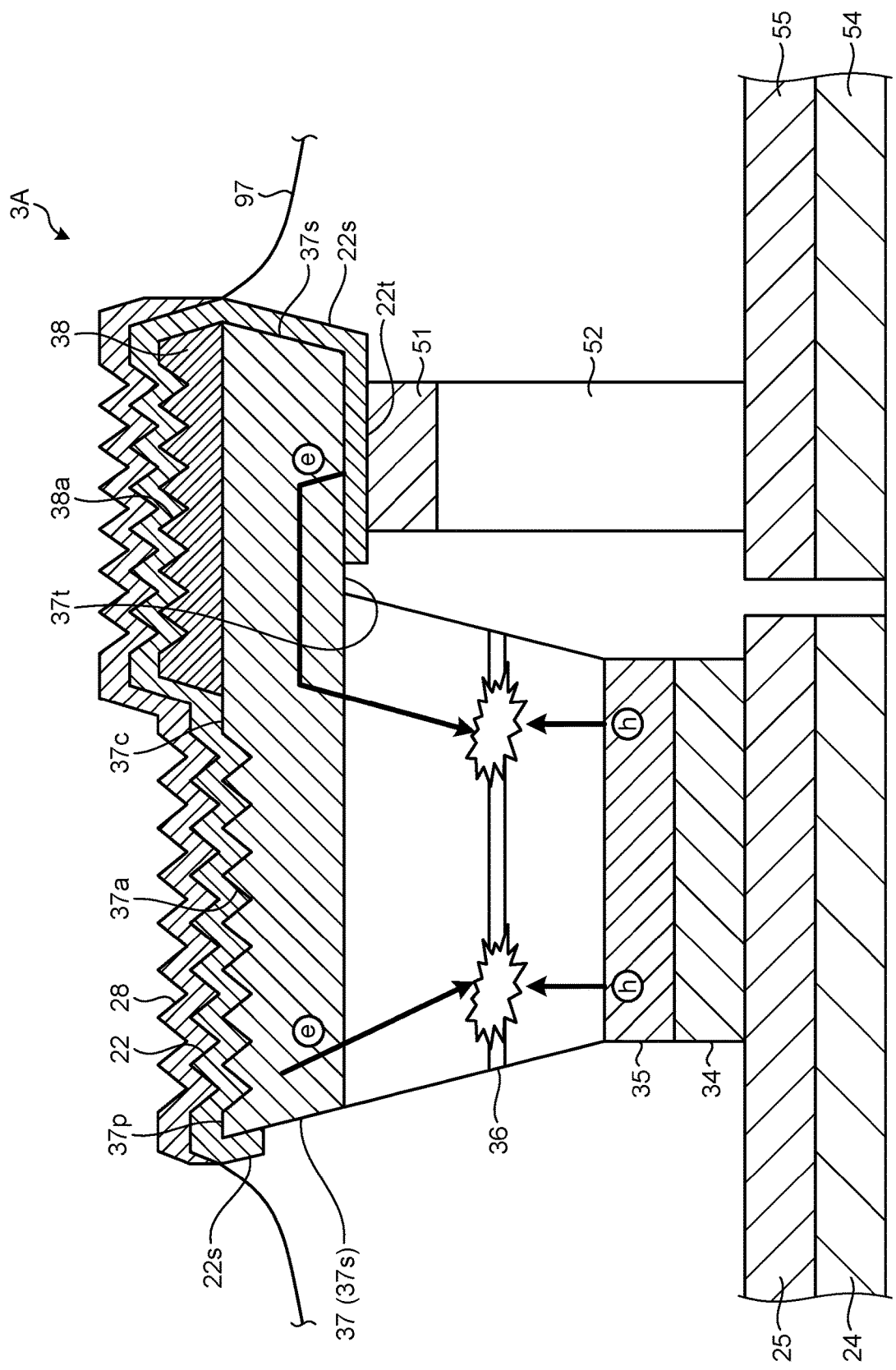
FIG. 10 is a sectional view schematically illustrating the light emitting element included in the display device according to a second embodiment.

FIG. 10 is a sectional view schematically illustrating the light emitting element included in the display device according to a second embodiment. In the following description, the same components as those described in the embodiment above are denoted by like reference numerals, and overlapping explanation thereof is omitted.

As illustrated in FIG. 10, a light emitting element 3A according to the second embodiment is a flip-chip light emitting element in which the p-type electrode 34 and an n-type electrode 51 are provided facing the array substrate 2. In the array substrate 2, the first mounting electrode 24 and a second mounting electrode 54 are disposed side by side. The light emitting element 3A is disposed over the first mounting electrode 24 and the second mounting electrode 54. The p-type electrode 34 and the n-type electrode 51 of the light emitting element 3A are provided side by side in planar view seen from the direction perpendicular to the substrate 21. The p-type electrode 34 is coupled to the lower surface of the p-type cladding layer 35. The p-type electrode 34 is electrically coupled to the first mounting electrode 24 via the connection member 25. The n-type electrode 51 is coupled to the lower surface of the n-type cladding layer 37. The n-type electrode 51 is electrically coupled to the second mounting electrode 54 via a coupler 52 and a connection member 55.

More specifically, the light emitting element 3A includes the p-type electrode 34, the p-type cladding layer 35, the active layer 36, and the n-type cladding layer 37 stacked in order on the first mounting electrode 24 and the connection member 25. The n-type cladding layer 37 extends to a position overlapping the second mounting electrode 54. The n-type electrode 51 is provided on the surface of the n-type cladding layer 37 facing the array substrate 2. The n-type electrode 51 is coupled to the connection member 55 provided on the second mounting electrode 54 via the coupler 52.

The high-resistance layer 38 is provided in a region overlapping the n-type electrode 51 on the upper surface of the n-type cladding layer 37. The high-resistance layer 38 does not overlap the center part 37c and the peripheral part 37p on the upper surface of the n-type cladding layer 37. The center part 37c on the upper surface of the n-type cladding layer 37 has a plurality of recesses 37a. The upper surface of the high-resistance layer 38 has a plurality of recesses 38a.

The cathode electrode 22 covers the upper surface of the n-type cladding layer 37, the high-resistance layer 38, and a side surface 37s of the n-type cladding layer and is coupled to the n-type electrode 51 on the lower surface of the n-type cladding layer 37. Specifically, the cathode electrode 22 covers the high-resistance layer 38 and is coupled to the center part 37c and the peripheral part 37p of the n-type cladding layer 37. In addition, an overlapping part 22t of the cathode electrode 22 is coupled to the n-type electrode 51 on the lower surface of the n-type cladding layer 37. In other words, the overlapping part 22t of the cathode electrode 22 is provided overlapping the n-type electrode 51 at an extending part 37t of the n-type cladding layer 37. A side part 22s of the cathode electrode 22 is provided covering the side surface 37s of the n-type cladding layer 37 and couples the cathode electrode 22 on the upper surface of the n-type cladding layer 37 and the overlapping part 22t.

The side part 22s of the cathode electrode 22 is also provided covering the side surface 37s of the n-type cladding layer 37 positioned closer to the p-type electrode 34 and farther away from the n-type electrode 51. The side part 22s is provided surrounding the side surface 37s of the n-type cladding layer 37. The configuration is not limited thereto, and the side part 22s simply needs to be provided coupling at least the cathode electrode 22 on the upper surface and the overlapping part 22t and may be provided to part of the side surface 37s of the n-type cladding layer 37.

The element insulating film 97 is provided covering the part below the side part 22s of the cathode electrode 22. The element insulating film 97 is provided between the n-type electrode 51 and the p-type electrode 34 and between the first mounting electrode 24 and the second mounting electrode 54. This configuration secures insulation between the anode and the cathode of the light emitting element 3A.

The insulating film 28 is stacked on the cathode electrode 22 in a region overlapping the high-resistance layer 38 and the center part 37c and the peripheral part 37p of the n-type cladding layer 37. As illustrated in FIG. 10, the insulating film 28 covers the side surfaces of the cathode electrode 22 exposed from the element insulating film 97.

As described above, the light emitting element 3A according to the second embodiment includes the p-type electrode 34 and the n-type electrode 51. The p-type electrode 34 is coupled to the p-type cladding layer 35. The n-type electrode 51 is coupled to the n-type cladding layer 37. The p-type electrode 34 and the n-type electrode 51 are provided facing the substrate 21. The cathode electrode 22 covers the upper surface of the n-type cladding layer 37, the high-resistance layer 38, and the side surface 37s of the n-type cladding layer and is coupled to the n-type electrode 51 on the lower surface of the n-type cladding layer 37.

In the configuration according to the second embodiment, the extending part 37t of the n-type cladding layer 37 is supplied with the cathode power supply potential PVSS from the n-type electrode 51, and the center part 37c, the peripheral part 37p, and the side surface 37s closer to the p-type electrode 34 of the n-type cladding layer 37 are supplied with the cathode power supply potential PVSS via the cathode electrode 22. With this configuration, the light emitting element 3A has not only a current path passing through the extending part 37t of the n-type cladding layer 37 and the p-type cladding layer but also a current path in the center part 37c and the peripheral part 37p closer to the p-type electrode 34 of the n-type cladding layer 37. As a result, the light emitting element 3A satisfactorily emits light not only near the extending part 37t but also in the peripheral part 37p positioned closer to the p-type electrode 34 and farther away from the n-type electrode 51 compared with a configuration where the n-type electrode 51 is provided to the extending part 37t without the cathode electrode 22. The light emitting element 3A thus reduces the difference in relative luminance. Consequently, the flip-chip light emitting element 3A according to the second embodiment can also improve the emission distribution characteristics.

The configuration of the light emitting element 3A may be appropriately modified. The shape and the position of the high-resistance layer 38, for example, is not limited to those illustrated in FIG. 10. The high-resistance layer 38 may have a frame shape with the opening OP like the first embodiment.

Figure 11:
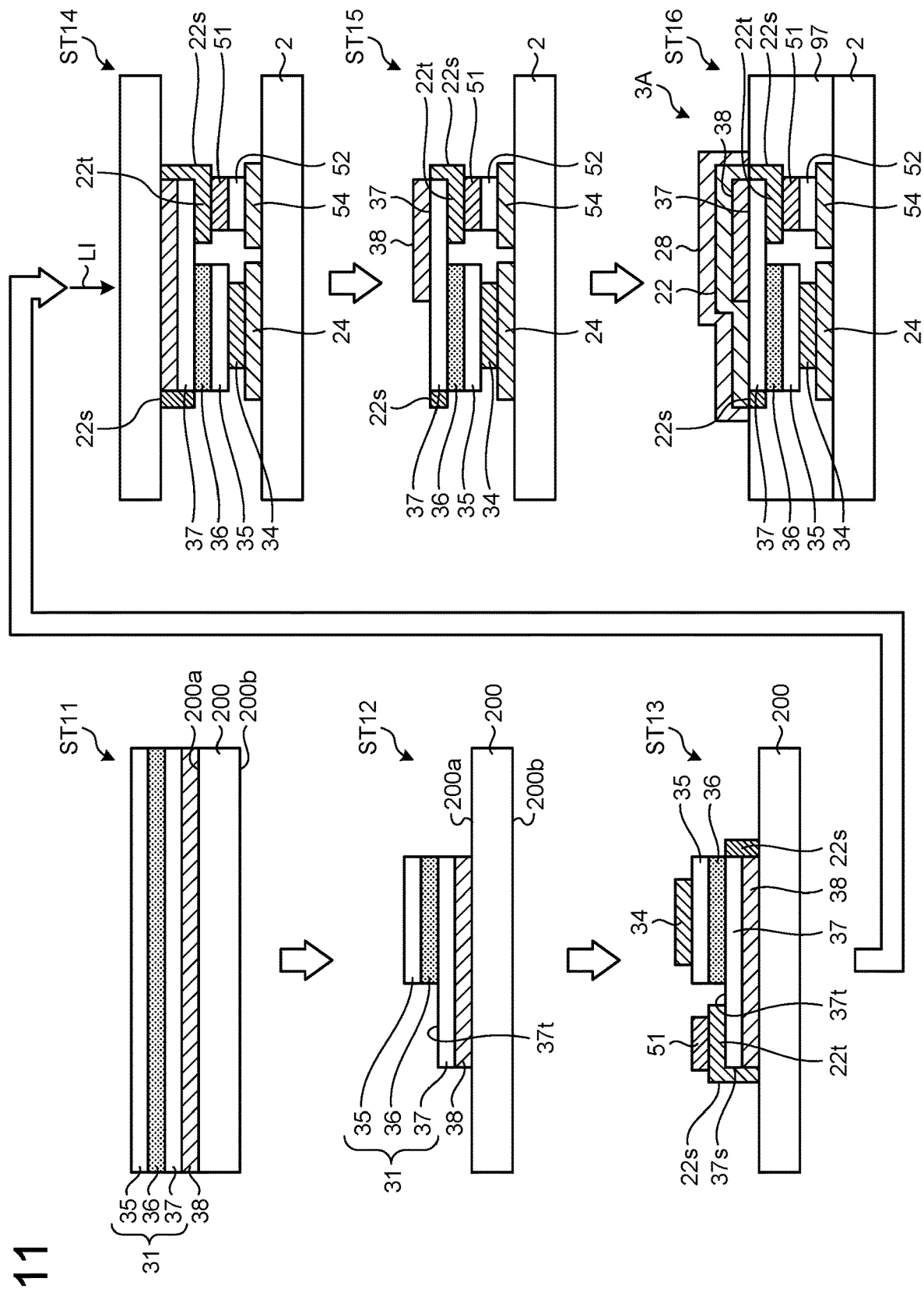
FIG. 11 is a view for explaining the method for manufacturing the display device according to the second embodiment.

The following describes a method for manufacturing the light emitting element 3A. FIG. 11 is a view for explaining the method for manufacturing the display device according to the second embodiment.

As illustrated in FIG. 11, the manufacturing apparatus forms the semiconductor layer 31 on the first surface 200a of the support substrate 200 (Step ST11). Specifically, the manufacturing apparatus forms the high-resistance layer 38, the n-type cladding layer 37, the active layer 36, and the p-type cladding layer 35 in order on the first surface 200a of the support substrate 200.

Subsequently, the manufacturing apparatus patterns the semiconductor layer 31 by photolithography and etching (Step ST12). As a result, the extending part 37t of the n-type cladding layer 37 is formed.

Subsequently, the manufacturing apparatus forms the cathode electrode 22 and patterns the overlapping part 22t and the side part 22s. Subsequently, the manufacturing apparatus forms the p-type electrode 34 on the p-type cladding layer 35 and forms the n-type electrode 51 on the overlapping part 22t of the cathode electrode 22 (Step ST13).

Subsequently, the manufacturing apparatus disposes the first surface 200a of the support substrate 200 so as to face the array substrate 2. The manufacturing apparatus brings the p-type electrode 34 into contact with the first mounting electrode 24 and couples the n-type electrode 51 to the second mounting electrode 54 via the coupler 52. The laser device then irradiates the semiconductor layer 31 with the laser light LI (Step ST14). Similarly to the first embodiment, the manufacturing apparatus detaches the semiconductor layer 31 from the support substrate 200 by a laser lift-off technology.

Subsequently, the manufacturing apparatus patterns the high-resistance layer 38 by photolithography and etching (Step ST15). As a result, the high-resistance layer 38 is provided in a region overlapping the n-type electrode 51 on the upper surface of the n-type cladding layer 37 and is removed in the center part 37c and the peripheral part 37p.

Subsequently, the manufacturing apparatus forms the element insulating film 97 between the light emitting elements 3A and forms the cathode electrode 22 and the insulating film 28 to cover the light emitting element 3A and the element insulating film 97 (Step ST16). As a result, the cathode electrode 22 provided on the upper surface of the n-type cladding layer 37 is electrically coupled to the side part 22s and the overlapping part 22t formed at Step ST13. As illustrated in FIG. 11, the insulating film 28 is formed to cover the side surfaces of the cathode electrode 22 exposed from the element insulating film 97.

By the manufacturing method described above, the cathode electrode 22 can be formed to cover the extending part 37t on the lower surface of the n-type cladding layer 37, the side surface 37s, the peripheral part 37p, the high-resistance layer 38, and the center part 37c.

By the process described above, the flip-chip light emitting element 3A can be transferred and mounted on the array substrate 2. The manufacturing method illustrated in FIG. 11 is given by way of example only and may be appropriately modified.

First Modification

Figure 12:
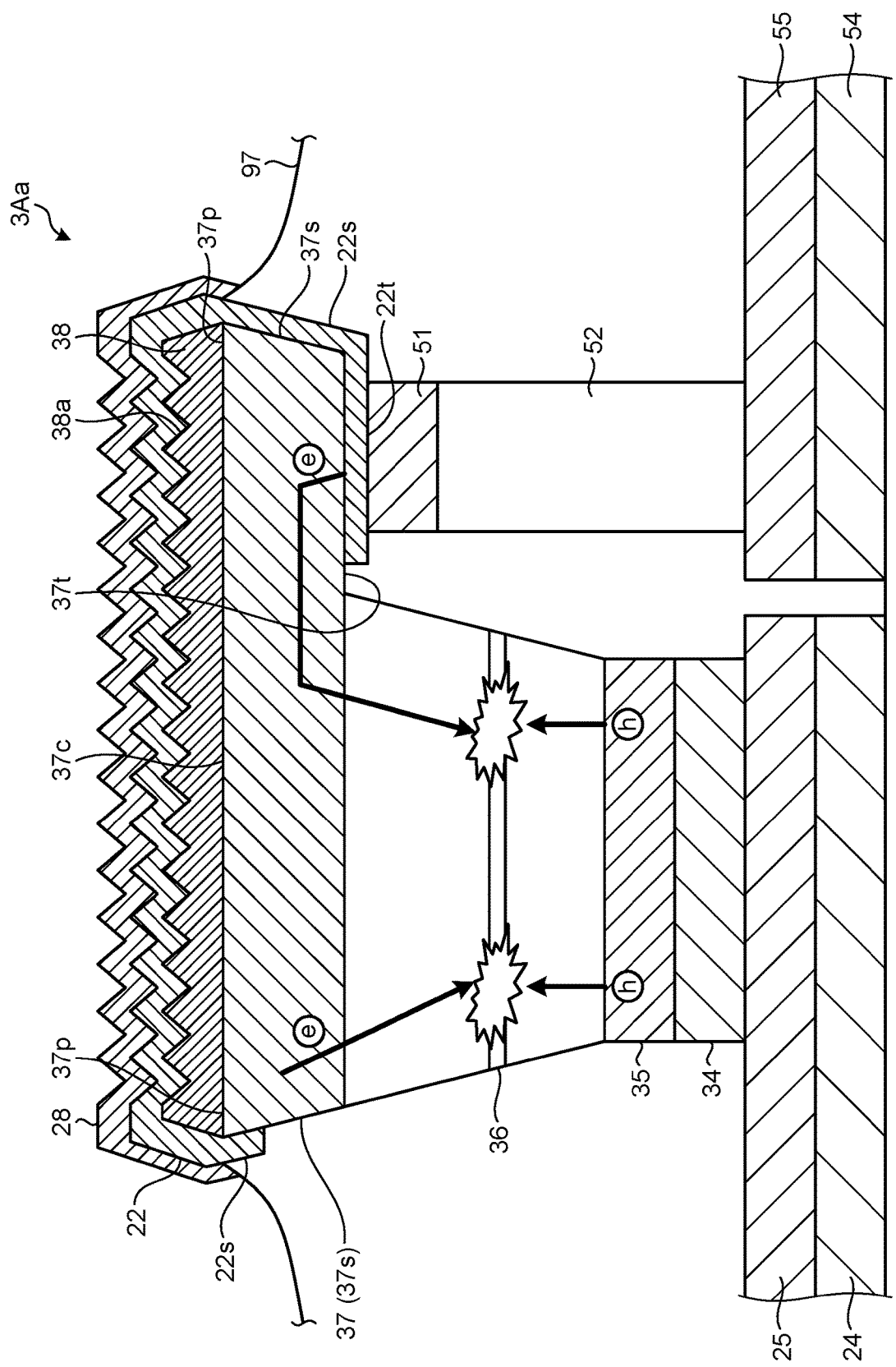
FIG. 12 is a sectional view schematically illustrating the light emitting element according to a first modification of the second embodiment.

FIG. 12 is a sectional view schematically illustrating the light emitting element according to a first modification of the second embodiment. In a light emitting element 3Aa according to the first modification illustrated in FIG. 12, the high-resistance layer 38 is provided covering the whole region on the upper surface of the n-type cladding layer 37. In other words, the high-resistance layer 38 is provided covering the center part 37c and the peripheral part 37p of the n-type cladding layer 37. The light emitting element 3Aa according to the first modification can be manufactured without patterning the high-resistance layer 38 at Step ST15 in FIG. 11.

The cathode electrode 22 is stacked on the high-resistance layer 38 and is not coupled to the center part 37c or the peripheral part 37p of the n-type cladding layer 37. The side part 22s of the cathode electrode 22 is coupled to the side surface 37s of the n-type cladding layer 37. With this configuration, the light emitting element 3Aa according to the first modification has not only a current path in the extending part 37t of the n-type cladding layer 37 but also a current path in the side surface 37s closer to the p-type electrode 34 of the n-type cladding layer 37. As a result, the light emitting element 3Aa according to the first modification can improve the emission distribution characteristics compared with a configuration where the n-type electrode 51 is provided to the extending part 37t without the cathode electrode 22.

Second Modification

Figure 13:
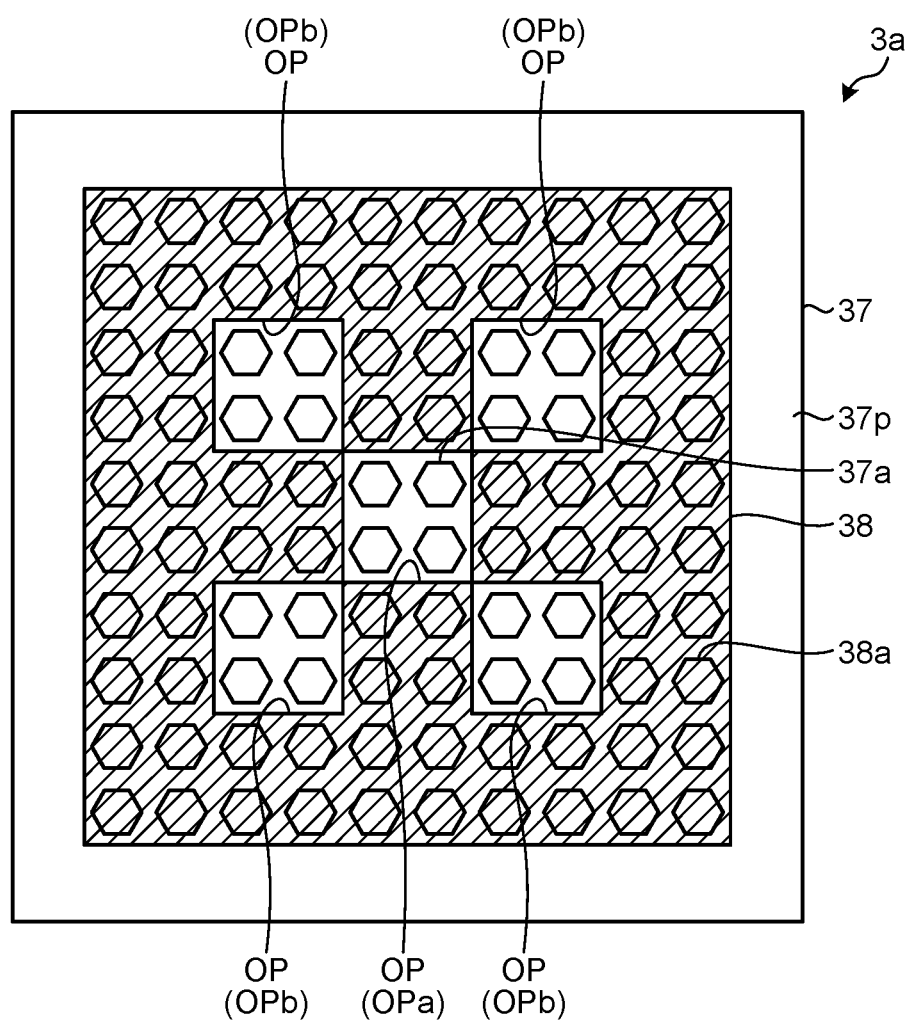
FIG. 13 is a plan view schematically illustrating the light emitting element according to a second modification in FIG. 6.

FIG. 13 is a plan view schematically illustrating the light emitting element according to a second modification in FIG. 6. As illustrated in FIG. 13, a light emitting element 3a according to the second modification is different from the light emitting element 3 illustrated in FIG. 6 in that a plurality of openings OP are formed near the center of the high-resistance layer 38. In FIG. 13, the high-resistance layer 38 has one opening OP (OPa) positioned at the center and a plurality of openings OP (OPb) formed around the opening OP (OPa) positioned at the center.

Third Modification

Figure 14:
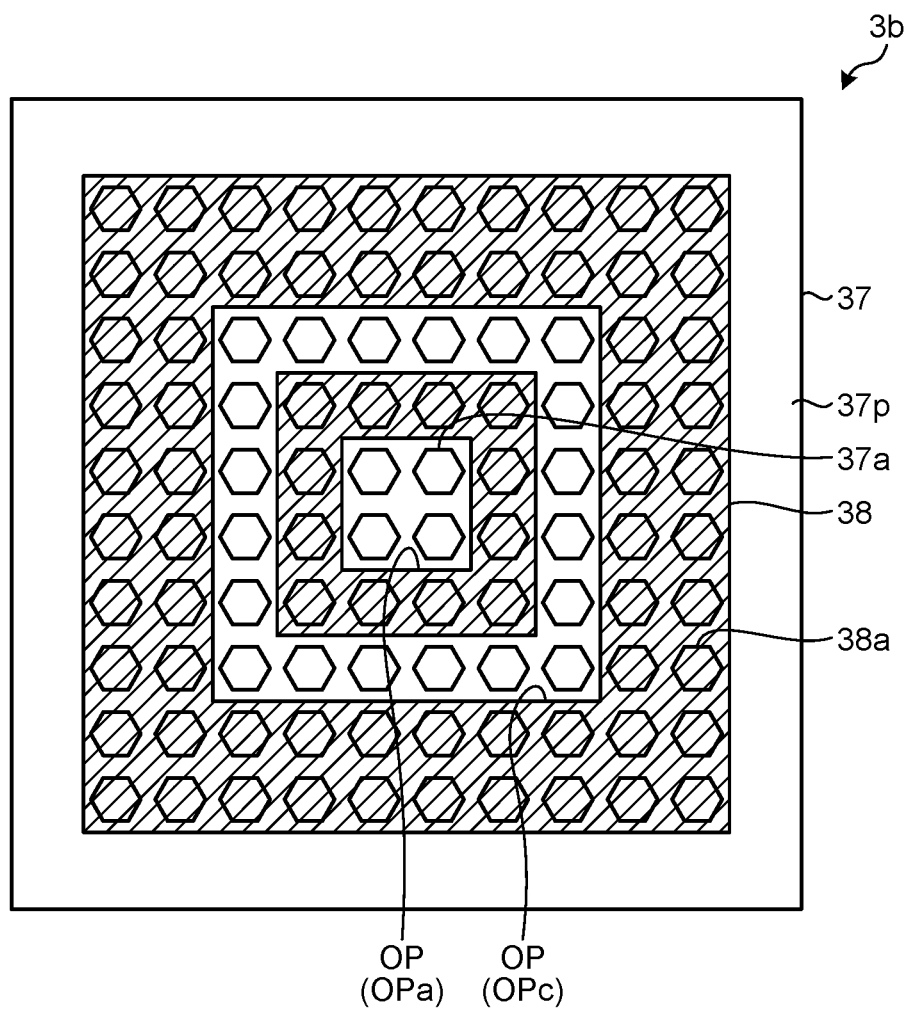
FIG. 14 is a plan view schematically illustrating the light emitting element according to a third modification in FIG. 6.

FIG. 14 is a plan view schematically illustrating the light emitting element according to a third modification in FIG. 6. As illustrated in FIG. 14, a light emitting element 3b according to the third modification has a first opening OP (OPa) positioned at the center and a second opening OP (OPc) formed surrounding the first opening OP (OPa) positioned at the center. In other words, the opening OP is not necessarily the one formed at the center illustrated in FIG.

6. To obtain desired optical characteristics, the position and the shape of the opening OP may be modified.

While an exemplary embodiment according to the present disclosure has been described, the embodiment is not intended to limit the disclosure. The contents disclosed in the embodiment are given by way of example only, and various changes may be made without departing from the spirit of the present disclosure. Appropriate changes made without departing from the spirit of the present disclosure naturally fall within the technical scope of the disclosure. At least one of various omissions, substitutions, and changes of the components may be made without departing from the gist of the embodiment above and the modifications thereof.

What is claimed is:

1. A display device comprising:
   a substrate;
   a plurality of pixels provided to the substrate;
   a plurality of light emitting elements provided to each of the pixels; and
   a cathode electrode covering the light emitting elements, wherein
   the light emitting elements each include a p-type cladding layer, an active layer, an n-type cladding layer, and a high-resistance layer stacked in order on the substrate,
   sheet resistance of the high-resistance layer is higher than sheet resistance of the n-type cladding layer,
   an upper surface of the n-type cladding layer has a plurality of recesses, and
   the cathode electrode covers the high-resistance layer and is directly coupled to the recesses and a peripheral part of the n-type cladding layer.

2. The display device according to claim 1, wherein
   the outer shape of the high-resistance layer is smaller than the outer shape of the n-type cladding layer,
   the high-resistance layer has an opening, and
   the cathode electrode is coupled to the peripheral part of the n-type cladding layer positioned on an outer side than the high-resistance layer and to the recesses in a center part of the n-type cladding layer through the opening of the high-resistance layer.

3. The display device according to claim 1, wherein
   the light emitting element further comprises:
      a p-type electrode coupled to the p-type cladding layer; and
      an n-type electrode coupled to the n-type cladding layer,
   the p-type electrode and the n-type electrode are provided facing the substrate, and
   the cathode electrode covers the recesses formed on the upper surface of the n-type cladding layer, the high-resistance layer, and a side surface of the n-type cladding layer and is coupled to the n-type electrode on a lower surface of the n-type cladding layer.

4. The display device according to claim 3, wherein
   the high-resistance layer is provided in a region overlapping the n-type electrode on the upper surface of the n-type cladding layer, and
   the cathode electrode covers the upper surface of the n-type cladding layer and part of a side surface of the n-type cladding layer closer to the p-type electrode.

5. The display device according to claim 1, wherein an upper surface of the high-resistance layer has a plurality of recesses.

6. The display device according to claim 5, wherein
   the recesses of the n-type cladding layer and the recesses of the high-resistance layer each have an inclining side wall, and
   an angle formed by the side wall of the recess and a direction parallel to the substrate in the center part of the n-type cladding layer is smaller than an angle formed by the side wall of the recess and the direction parallel to the substrate on the upper surface of the high-resistance layer.

7. The display device according to claim 1, wherein a refractive index of the cathode electrode is 1.5 to 1.9.

8. The display device according to claim 1, further comprising an insulating film covering the cathode electrode, wherein
   a refractive index of the insulating film and a refractive index of the cathode electrode is lower than a refractive index of the n-type cladding layer.

\* \* \* \* \*